United States Patent
Hsia et al.

(10) Patent No.: US 10,141,443 B2
(45) Date of Patent: Nov. 27, 2018

(54) SEMICONDUCTOR DEVICES FINFET DEVICES WITH OPTIMIZED STRAINED-SOURECE-DRAIN RECESS PROFILES AND METHODS OF FORMING THE SAME

(71) Applicant: Taiwan Semiconductor Manufacturing Co., Ltd., Hsinchu (TW)

(72) Inventors: Ying Ting Hsia, Kaohsiung (TW); Kun Yu Lin, Kaohsiung (TW); Ying Ming Wang, Tainan (TW); Li-Te Hsu, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 36 days.

(21) Appl. No.: 15/080,551

(22) Filed: Mar. 24, 2016

(65) Prior Publication Data
US 2017/0278972 A1     Sep. 28, 2017

(51) Int. Cl.
*H01L 29/78*     (2006.01)
*H01L 29/66*     (2006.01)

(52) U.S. Cl.
CPC .... *H01L 29/7853* (2013.01); *H01L 29/66818* (2013.01)

(58) Field of Classification Search
CPC ............ H01L 29/66795; H01L 29/785; H01L 29/7848; H01L 27/0886; H01L 27/0924
See application file for complete search history.

(56) References Cited

U.S. PATENT DOCUMENTS

| | | | |
|---|---|---|---|
| 8,796,759 B2* | 8/2014 | Perng ................... | H01L 29/165 257/328 |
| 9,093,298 B2* | 7/2015 | Ekbote ................... | H01L 27/088 |
| 2014/0141589 A1* | 5/2014 | Shin ................... | H01L 29/66568 438/306 |
| 2014/0252477 A1* | 9/2014 | Tseng ................ | H01L 29/66795 257/347 |
| 2014/0264575 A1* | 9/2014 | Tsai ................... | H01L 29/66492 257/336 |
| 2016/0314969 A1* | 10/2016 | Lin ....................... | H01L 21/283 |

\* cited by examiner

*Primary Examiner* — Steven Loke
*Assistant Examiner* — Scott Stowe
(74) *Attorney, Agent, or Firm* — JCIPRNET

(57) ABSTRACT

Semiconductor devices, FinFET devices with optimized strained-source-drain recess profiles and methods of forming the same are provided. One of the semiconductor devices includes a substrate, a gate stack over the substrate and a strained layer in a recess of the substrate and aside the gate stack. Besides, a ratio of a depth at the greatest width of the recess to a width of the gate stack ranges from about 0.5 to 0.7.

11 Claims, 11 Drawing Sheets

SEMICONDUCTOR DEVICES FINFET DEVICES WITH OPTIMIZED STRAINED-SOURECE-DRAIN RECESS PROFILES AND METHODS OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-type field-effect transistor (FinFET), has been introduced to replace a planar transistor. Although existing FinFET devices and methods of forming FinFET devices have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1A:
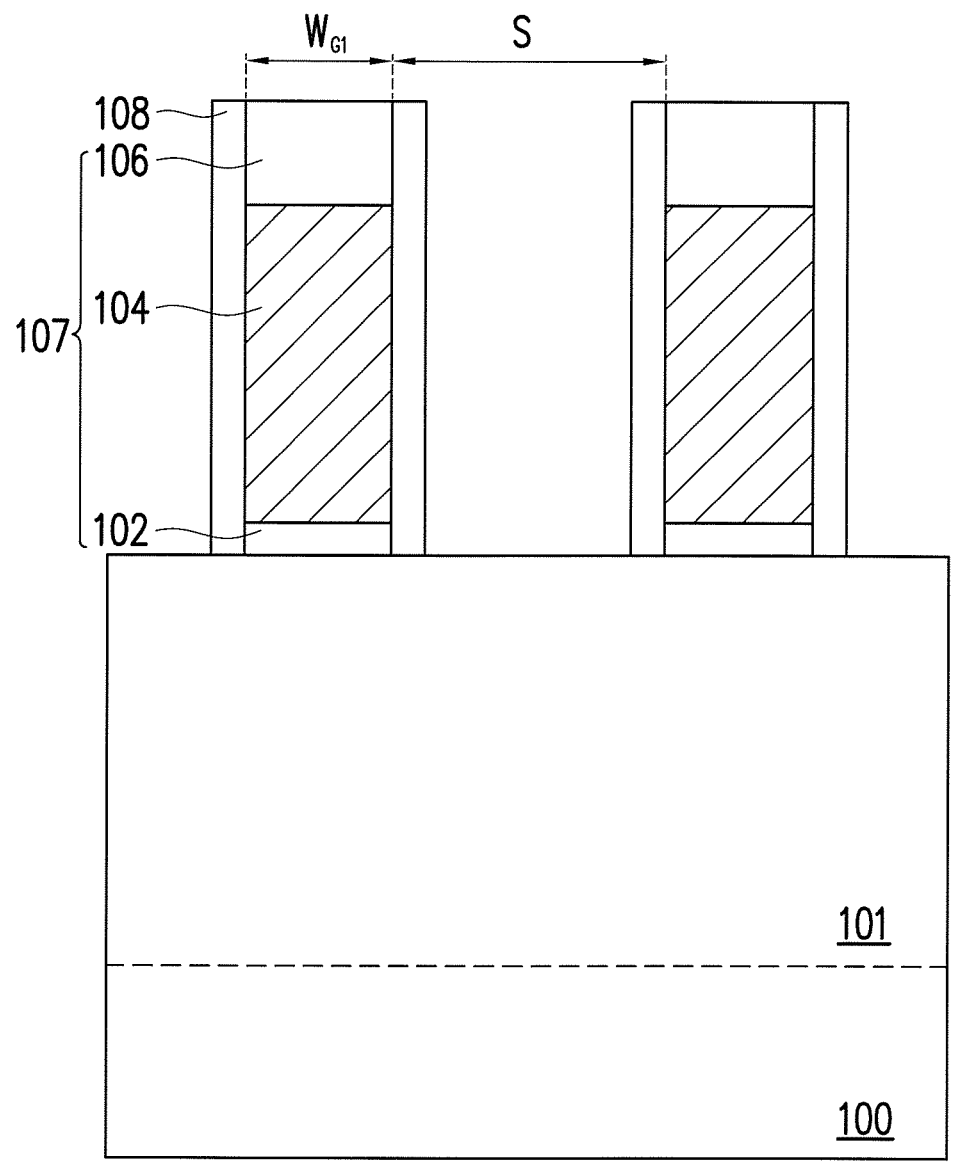
FIG. 1A to FIG. 1E are schematic cross-sectional views of a method of forming a FinFET device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A to FIG. 1E are schematic cross-sectional views of a method of forming a FinFET device in accordance with some embodiments.

Referring to FIG. 1A, a substrate 100 with one or more fins 101 is provided. In some embodiments, the substrate 100 includes a silicon-containing substrate, a silicon-on-insulator (SOI) substrate, or a substrate formed of other suitable semiconductor materials. Depending on the requirements of design, the substrate 100 may be a P-type substrate or an N-type substrate and may have doped regions therein. The doped regions may be configured for an N-type FinFET device or a P-type FinFET device. In some embodiments, the substrate 100 has an isolation layer formed thereon. Specifically, the isolation layer covers lower portions of the fins 101 and exposes upper portions of the fins 101. In some embodiments, the isolation layer is a shallow trench isolation (STI) structure.

In some embodiments, the substrate 100 has at least two gate stacks 107 formed thereon. In some embodiments, the gate stacks 107 extend in a direction different from (e.g., perpendicular to) the extending direction of the fins 101. In some embodiments, each of the gate stacks 107 includes, from bottom to top, an interfacial layer 102, a dummy gate 104 and an optional cap pattern 106. In some embodiments, the gate stacks 107 are referred to as "dummy gate stacks" through the description. In some embodiments, the interfacial layers 102 include silicon oxide, silicon oxynitride or a combination thereof, the dummy gates 104 include a silicon-containing material, such as polysilicon, amorphous silicon or a combination thereof, and the cap patterns 106 include SiN, SiC, SiCN, SiON, SiCON or a combination thereof. In some embodiments, the method of forming the gate stacks 107 includes forming a stacked layer on the substrate 100 and patterning the stacked layer with photolithography and etching processes. In some embodiments, the gate stacks 107 has a gate width $W_{G1}$ and a spacing width S between two adjacent gate stacks 107.

In some embodiments, the substrate 100 further has spacers 108 formed on sidewalls of the gate stacks 107. In some embodiments, the spacers 108 have a dielectric constant less than about 10, or even less than about 5. In some embodiments, the spacers 108 include a nitrogen-containing dielectric material, a carbon-containing dielectric material or both. In some embodiments, the spacers 108 include SiN, SiCN, SiOCN, SiOR (wherein R is an alkyl group such as $CH_3$, $C_2H_5$ or $C_3H_7$), SiC, SiOC, SiON, a combination thereof or the like. In some embodiments, the method of forming the spacers 108 includes forming a spacer material layer on the substrate 100, and partially removing the spacer material layer by an anisotropic etching process.

Figure 1B:
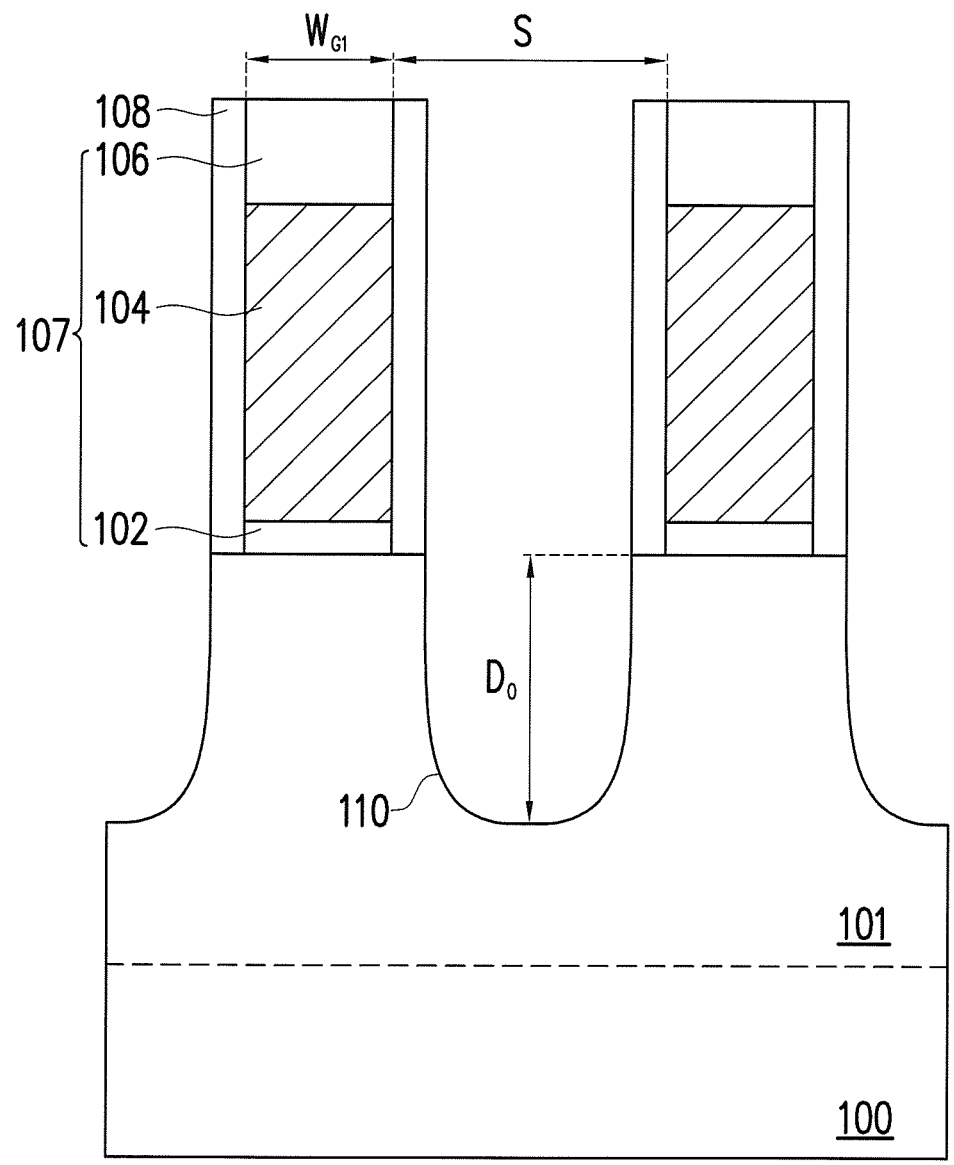

Referring to FIG. 1B, a first etching step is performed to form recesses 110 in the substrate 100 between the gate stacks 107. In some embodiments, the first etching step includes performing an anisotropic etching process, such as a dry etching process. In some embodiments, the recesses 110 are formed with a U-shaped profile, a cup-like profile or a bowl-like shape. In some embodiments, the top edge of at least one of the recesses 110 is aligned with the sidewalls of the adjacent spacers 108.

In some embodiments, the ratio of the width $W_{G1}$ of the gate stacks 107 to the depth $D_0$ (measuring from the surface of the substrate 100) of the recesses 110 ranges from about 0.4 to 0.7. In some embodiments, the ratio of $W_{G1}$ to $D_0$ can be, for example but is not limited to, about 0.40, 0.45, 0.50, 0.55, 0.60, 0.65, 0.70, including any range between any two of the preceding values.

Figure 1C:
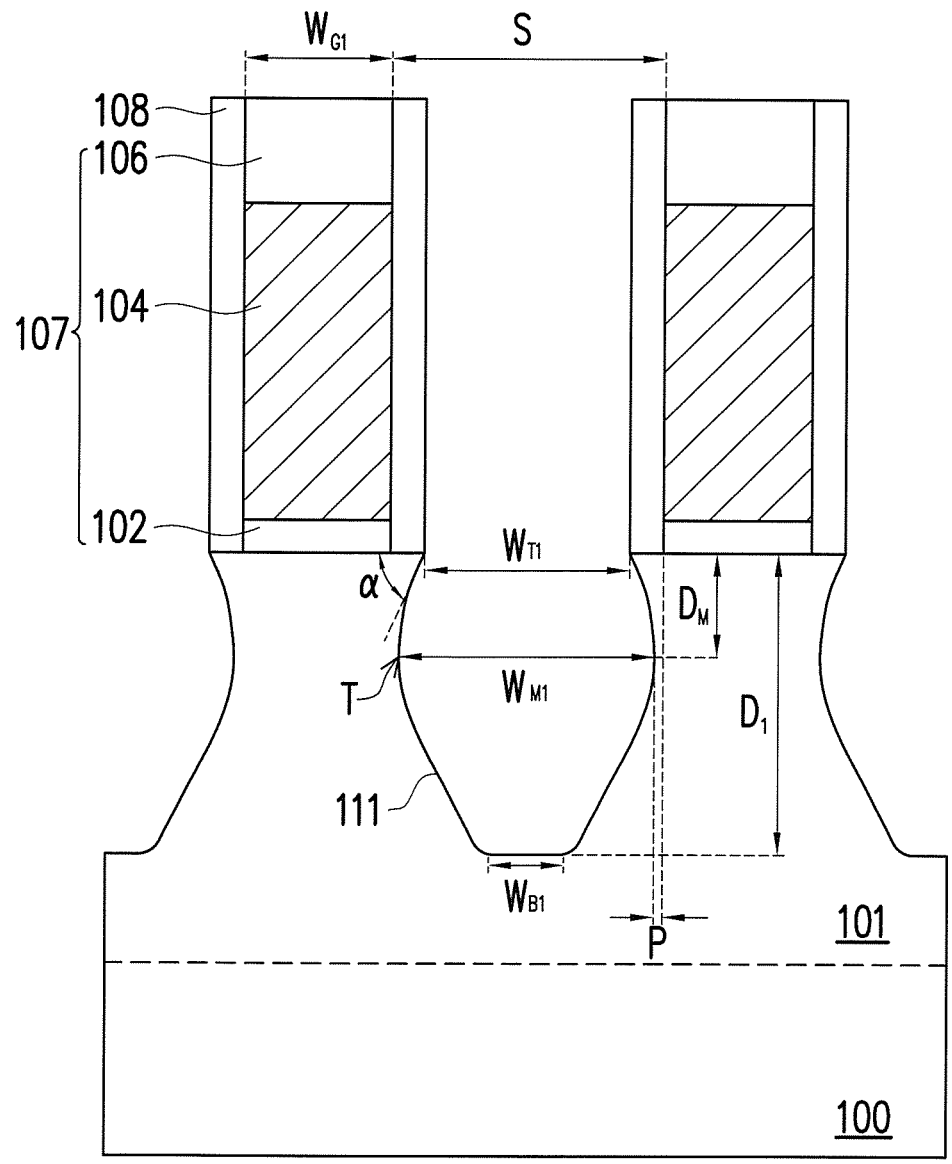

Referring to FIG. 1C, a second etching step is performed to deepen and widen the recess 110 and therefore form recesses 111. In some embodiments, the second etching step includes performing an isotropic etching process, such as a dry etching process. In some embodiments, each of the first and second etching steps is referred to as a self-aligned etching process by using the spacers 108 and the cap patterns 106 as self-aligned masks.

In some embodiments, the second etching step deepens the recesses to a depth $D_1$, and the ratio of the depth $D_0$ of recesses 110 to the depth $D_1$ of recesses 111 ranges from about 0.7 to 0.9, such as 0.7, 0.75, 0.8, 0.85 or 0.9, or any range between any two of the preceding values. In some embodiments, the second etching step simultaneously enlarges or widens the middle portion of the recesses to a width $W_{M1}$. Specifically, the recesses 111 are formed with a wide-middle profile or a diamond-like profile after the second etching step. In some embodiments, the middle width $W_{M1}$ of the recesses 111 is greater than each of the top width $W_{T1}$ and the bottom width $W_{B1}$ of the recesses 111. In some embodiments, the middle width $W_{M1}$ of the recesses 111 is the greatest width, and the top width $W_{T1}$ is greater than the bottom width $W_{B1}$ of the recesses 111, as shown in FIG. 1C.

In some embodiments, the second etching step deepens and widens the recesses without enlarging the top width of the recesses, so the top edge of at least one of the recesses 111 is aligned with the sidewalls of the adjacent spacers 108. In other words, the top edge of each recess 111 is not covered by the adjacent spacers 108. However, the disclosure is not limited thereto.

Figure 2:
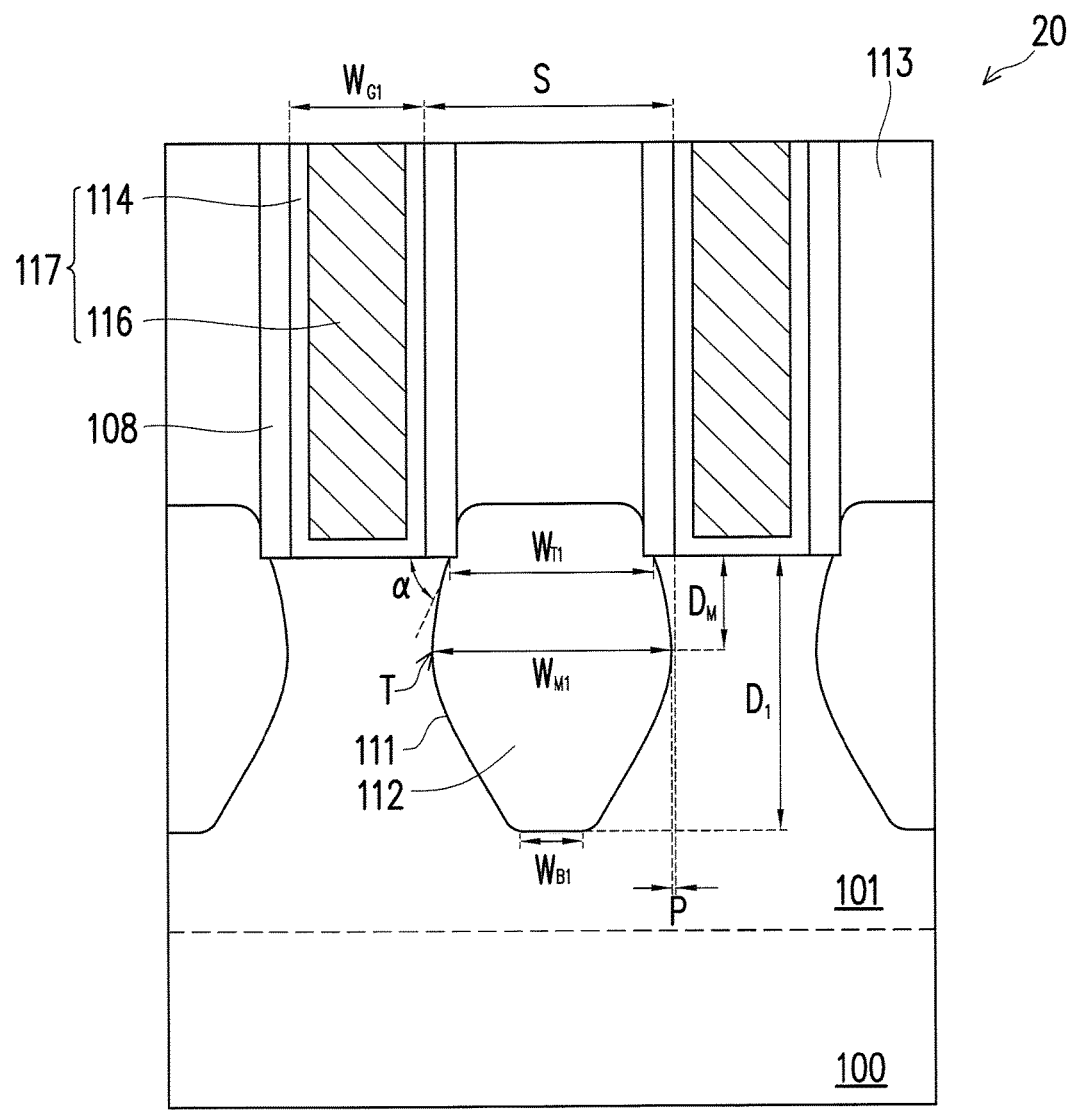
FIG. 2 is a schematic cross-sectional view of a FinFET device in accordance with alternative embodiments.

In alternative embodiments, the second etching step not only deepens and widens the recesses but also enlarges the top width of the recesses, so the recesses 111 extend to below the spacers 108 after the second etching step, as shown in FIG. 2. In such case, the top edge of at least one of the recesses 111 is covered by portions of the adjacent spacers 108.

In some embodiments, the etching profile of at least one of the recesses 111 defines a tip T substantially positioned at the intersection of the upper sidewall and lower sidewall of the recess 111. In some embodiments, the tip T of each recess 111 is located at a level of the greatest width of the recess 111. In some embodiments, at least one of the recesses 111 further defines a proximity P and a tip depth (or called "tip height") $D_M$. The proximity P defines a distance from the tip T to the sidewall of the adjacent gate stack 107. In some embodiments, the proximity P ranges from about zero to 7 nm. In some embodiments, the proximity P is about zero or greater than zero and less than or equal to 7 nm for an N-type FinFET device. In alternative embodiments, the proximity P is about zero or greater than zero and less than or equal to 4 nm for a P-type FinFET device. In some embodiments, the greatest width or the middle width $W_{M1}$ of the recesses 111 is no more than the spacing width S of the gate structures 107. From another point of view, the tip T of each recess 111 extends to below the adjacent spacers 108, without extending to below the adjacent gate stacks 107.

In some embodiments, the ratio of the depth $D_M$ at the greatest width of the recesses 111 to the total depth $D_1$ of the recesses 111 ranges from about ¼ to ⅓. In some embodiments, the ratio of $D_M$ to $D_1$ can be, for example but is not limited to, about 0.25, 0.27, 0.29, 0.31, 0.33, including any range between any two of the preceding values.

In some embodiments, the ratio of the depth $D_M$ at the greatest width of the recesses 111 to the $W_{G1}$ of the gate stacks 107 ranges from about 0.5 to 0.7. In some embodiments, the ratio of $D_M$ to $W_{G1}$ can be, for example but is not limited to, about 0.50, 0.55, 0.60, 0.65, 0.70, including any range between any two of the preceding values.

In some embodiments, the ratio of the width $W_{G1}$ of the gate stacks 107 to the greatest width or the middle width $W_{M1}$ of the recess 111 ranges from about 0.4 to 0.6. In some embodiments, the ratio of $W_{G1}$ to $W_{M1}$ can be, for example but is not limited to, about 0.40, 0.45, 0.50, 0.55, 0.60, including any range between any two of the preceding values.

In some embodiments, the included angle α formed between the surface of the substrate 100 and the upper sidewall of the adjacent recess 111 is substantially equal to or greater than about 50 degrees and less than 90 degrees. In some embodiments, the upper sidewalls of recesses 111 are slightly curved, and the included angle α is the angle between the surface of the substrate 100 and the tangent line to the upper sidewall of the adjacent recess 111 at the recess opening. For example, the included angle α can be, for example but is not limited to, about 50, 55, 60, 65, 70, 75, 80, 85, including any range between any two of the preceding values.

Figure 1D:
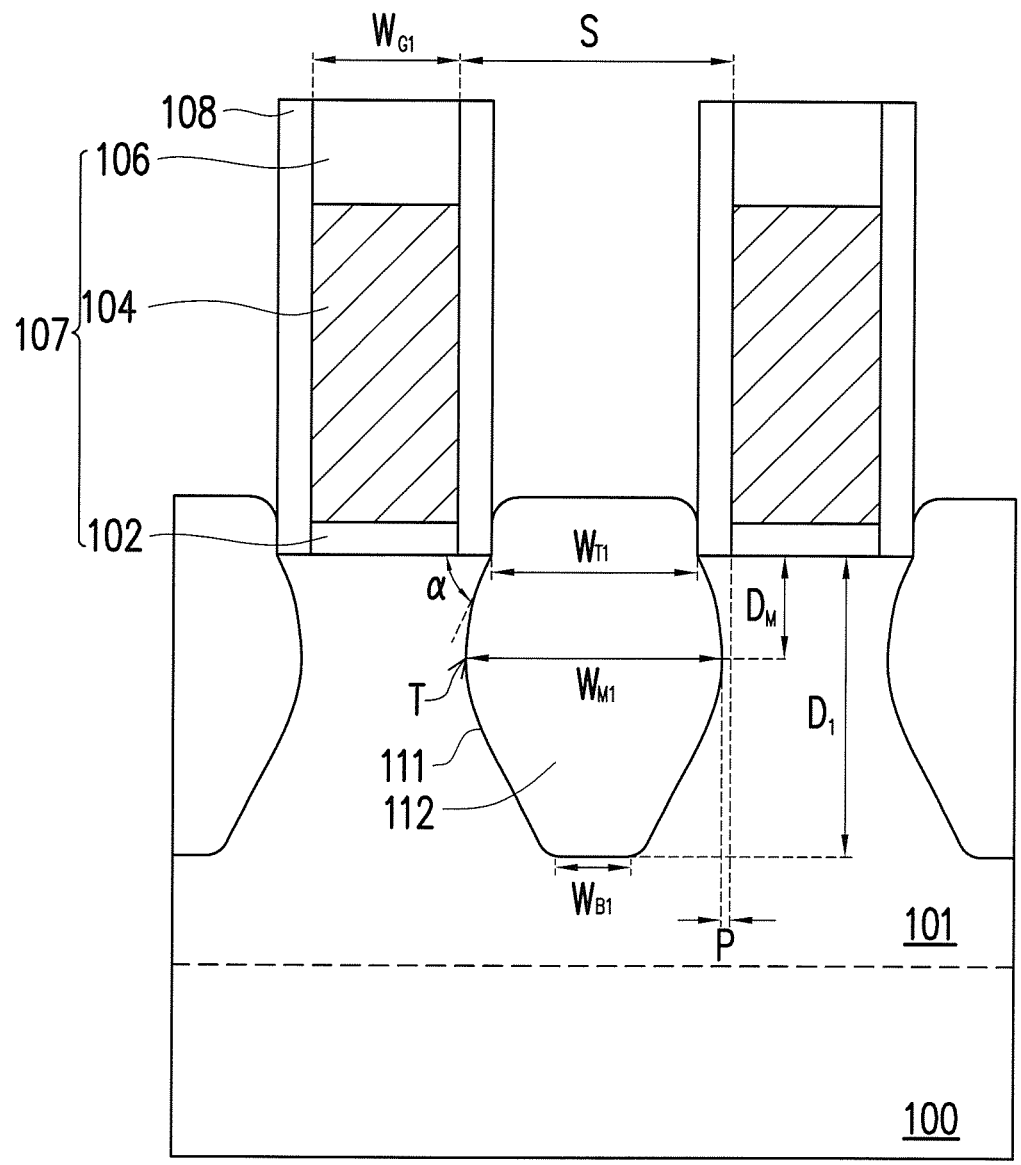

Referring to FIG. 1D, strained layers 112 are formed in the recesses 111. In some embodiments, two strained layers 112 are formed beside each of the gate stacks 107, and one of the strained layers 112 is between the adjacent gate stacks 107. In some embodiments, the strained layers 112 include silicon germanium (SiGe) for a P-type FinFET device. In alternative embodiments, the strained layers 112 include silicon carbon (SiC), silicon phosphate (SiP), SiCP or a SiC/SiP multi-layer structure for an N-type FinFET device. In some embodiments, the strained layers 112 may be optionally implanted with a P-type dopant or an N-type dopant as needed. In some embodiments, the method of forming the strained layers 112 includes growing epitaxy layers from the recesses 111. Specifically, the strained layers 112 are formed within the recesses 111 and extend upwardly along the sidewalls of the corresponding spacers 108. In some embodiments, the tops of the strained layers 112 are above the surface of the substrate 100. In alternative embodiments, the tops of the strained layers 112 are substantially coplanar with the surface of the substrate 100. In some embodiments, the strained layers 112 can be referred to as "source/drain regions".

In some embodiments, the adjacent strained layers 112 at the same side are separate from each other. In alternative embodiments, the adjacent strained layers 112 at the same side are connected with each other. In some embodiments, following the formation of the strained layers 112, silicide layers are formed by siliciding the top portions of the strained layers 112.

In some embodiments, the strained layers 112 has a shape/profile similar to that of recesses 111. In some embodiments, the strained layers 112 has a wide-middle profile or a diamond-like profile. In some embodiments, the top, middle and bottom widths of the strained layers 112 are substantially equal to the top, middle and bottom widths of the recesses 111, as shown in FIG. 1D. In alternative embodiments, the top, middle and bottom widths of the strained layers 112 are slightly greater than the top, middle and bottom widths of the recesses 111.

It is noted that in some embodiments, the profile of at least one of the recesses 111 is well controlled when the ratio of the gate width (e.g., $W_{G1}$) to the initial recess depth (e.g., $D_0$) and/or the ratio of the initial recess depth (e.g., $D_0$) to the final recess depth (e.g., $D_1$) fall within the above ranges.

It is also noted that in some embodiment, the profile of at least one of the recesses 111 is well defined when the ratio of the tip depth (e.g., $D_M$) of the recess to the gate width (e.g., $W_{G1}$), the ratio of the gate width (e.g., $W_{G1}$) to the greatest depth (e.g., $W_{M1}$) of the recess, the ratio of the tip depth (e.g., $D_M$) to the total depth (e.g., $D_1$) of the recess, and/or the included angle (e.g., $\alpha$) between the recess sidewall and the substrate surface fall within the above ranges. By controlling and adjusting the above ratios and/or the included angle within the ranges of the disclosure, the profile of the recesses 111 is well defined, the subsequently formed strained layers 112 are suitable to impart more stress on the channel regions, and the electrical performance of the device is accordingly boosted.

Specifically, when the ratios of $D_M$ to $W_{G1}$, $W_{G1}$ to $W_{M1}$ and $D_M$ to $D_1$ and the included angle $\alpha$ are over the upper limits, the saturation current is too low. When the ratios of $D_M$ to $W_{G1}$, $W_{G1}$ to $W_{M1}$ and $D_M$ to $D_1$ and the included angle $\alpha$ are below the lower limits, the leakage current may easily occur because the dummy gates may be damaged during the recess forming step.

Figure 1E:
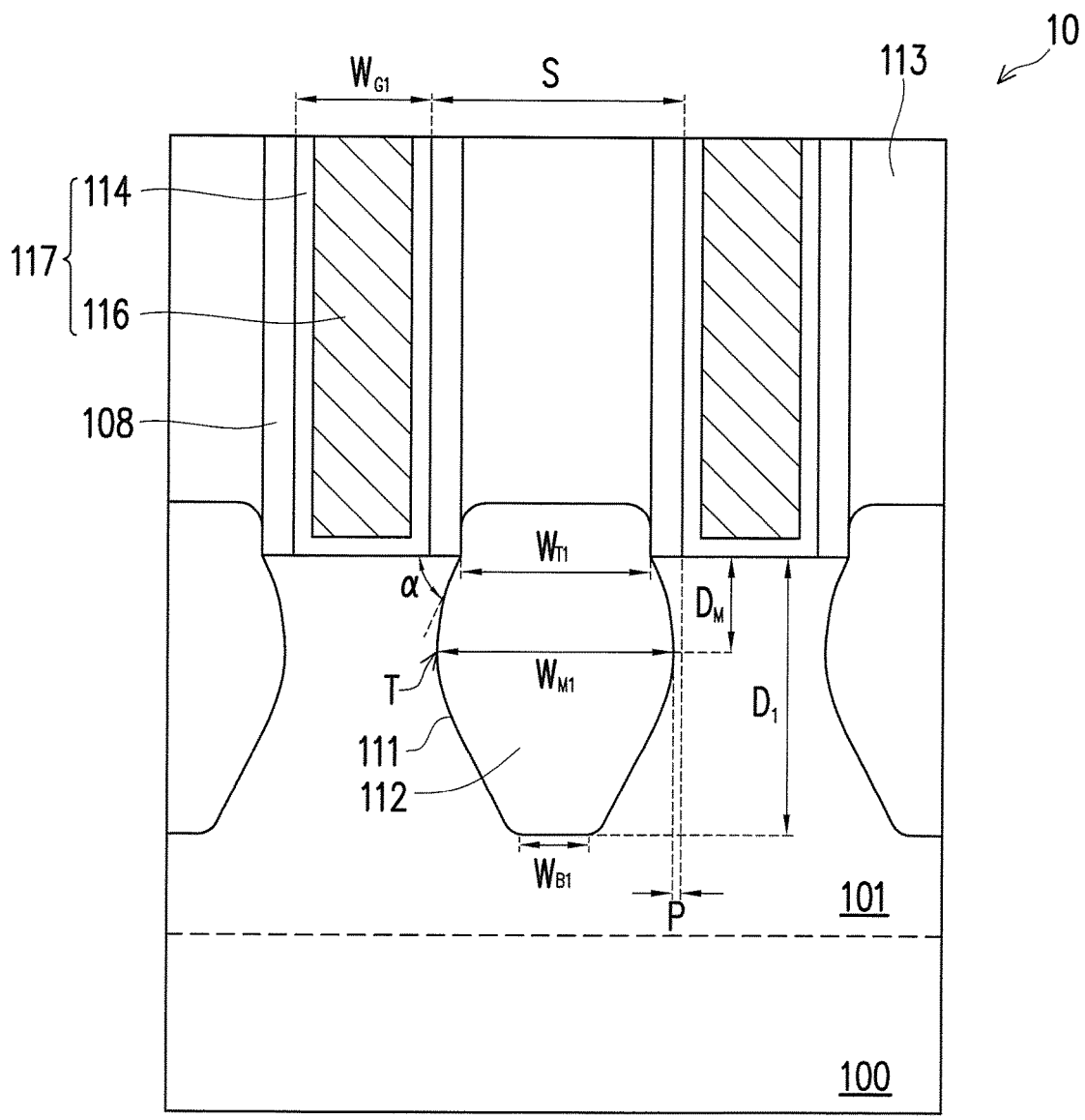

Referring to FIG. 1E, a dielectric layer 113 is formed aside the gate stacks 107 and over the strained layers 112. In some embodiments, the dielectric layer 113 includes nitride such as silicon nitride, oxide such as silicon oxide, phosphosilicate glass (PSG), borosilicate glass (BSG), boron-doped phosphosilicate glass (BPSG), a combination thereof or the like. In some embodiments, the top surface of the dielectric layer 113 is substantially level with the top surfaces of the gate stacks 107. The dielectric layer 113 may be filled until its top surface is higher than the top surfaces of the cap patterns 106 by a suitable fabrication technique such as spin-coating, CVD, flowable CVD, PECVD, ALD, a combination or the like. A planarization step such as CMP is then performed to remove the excess dielectric layer. In some embodiments, a contact etch stop layer (CESL) is formed after the step of forming the strained layers 112 and before the step of forming the dielectric layer 113, and the CESL includes SiN, SiC or the like.

Thereafter, the dummy gate stacks 107 are replaced with gate stacks 117. In some embodiments, the gate stacks 117 are referred to as "metal gate stacks" through the description. In some embodiments, the gate stacks 107 are removed to form gate trenches in the dielectric layer 113, and the gate stacks 117 are then formed in the gate trenches. In some embodiments, the method of forming the gate stacks 117 includes forming a stacked layer with CVD, PVD, plating, or a suitable process, and then performing a CMP process to remove the stacked layer outside of the gate trenches. In some embodiments, the top surface of the dielectric layer 113 is substantially level with the top surfaces of the gate stacks 117. In some embodiments, the shape, profile and width of the gate stacks 117 are substantially similar to the shape, profile and width of the gate stacks 107.

In some embodiments, each of the gate stacks 117 includes a gate dielectric layer 114 and a gate 116 (or called "replacement gate"). In some embodiments, the gate stacks 117 extend in a direction different from (e.g., perpendicular to) the extending direction of the fins 101. In some embodiments, each of the gate dielectric layers 114 surrounds the sidewall and bottom of the corresponding gate 116 and on the top and sidewall of each fin 101, as shown in FIG. 1E. In some embodiments, silicon oxide layers are formed between the fins 101 and the gate dielectric layers 114.

In some embodiments, each of the gate dielectric layers 114 includes a high-k material having a dielectric constant greater than about 10. In some embodiments, the high-k material includes metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, a combination thereof, or a suitable material. In alternative embodiments, each of the gate dielectric layers 114 can optionally include a silicate such as HfSiO, LaSiO, AlSiO, a combination thereof, or a suitable material.

In some embodiments, each of the gates 116 includes a metal material suitable for forming a metal gate or portion thereof. In some embodiments, each of the gates 116 includes a work function metal layer and a fill metal layer on the work function metal layer. The work function metal layer is an N-type work function metal layer or a P-type work function metal layer. In some embodiments, the N-type work function metal layer includes TiAl, TiAlN, or TaCN, conductive metal oxide, and/or a suitable material. In alternative embodiments, the P-type work function metal layer includes TiN, WN, TaN, conductive metal oxide, and/or a suitable material. The fill metal layer includes copper, aluminum, tungsten, or a suitable material. In some embodiments, each of the gates 116 can further include a liner layer, an interface layer, a seed layer, an adhesion layer, a barrier layer, a combination thereof or the like. The FinFET device 10 of the disclosure is thus completed.

Figure 3:
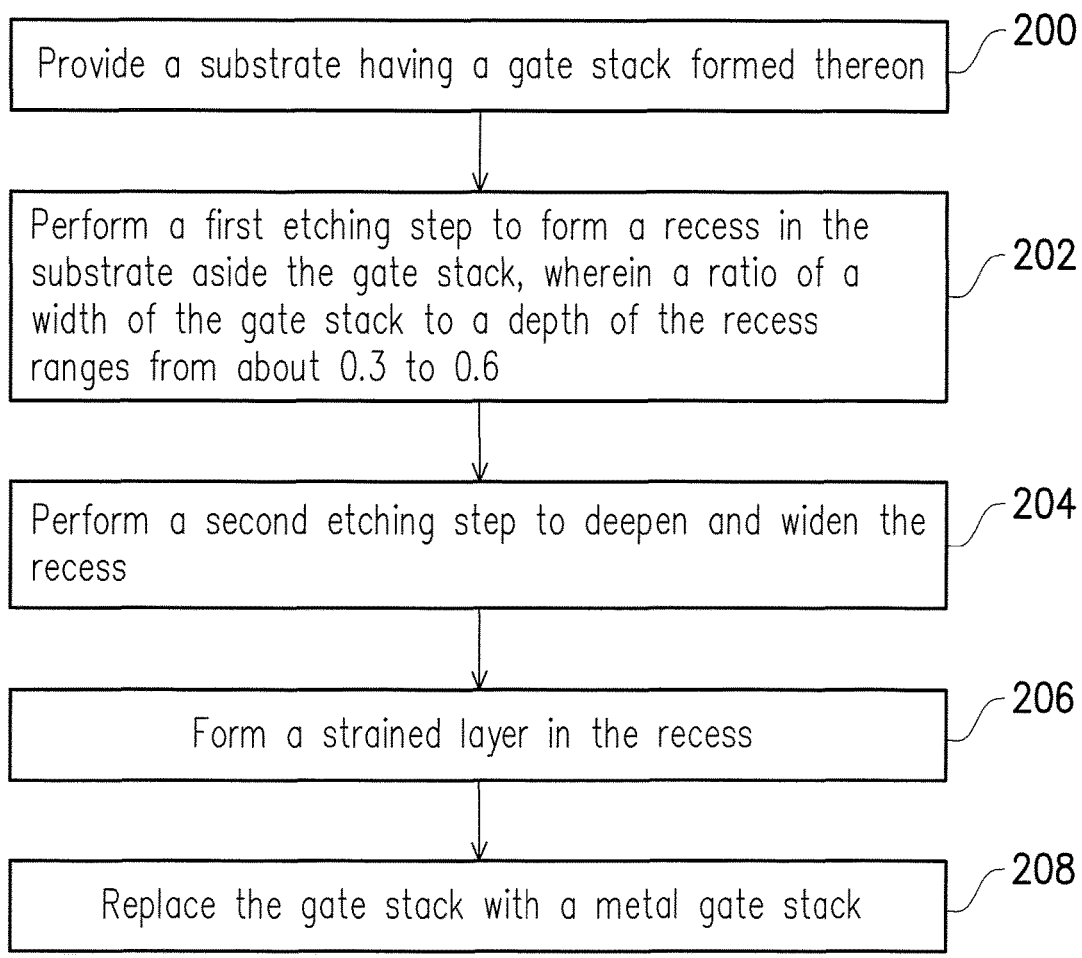
FIG. 3 is a flow chart of a method of forming a FinFET device in accordance with some embodiments.

The above-mentioned process steps in FIG. 1A to FIG. 1E can be concisely illustrated with reference to the flow chart of FIG. 3.

At step 200, a substrate 100 is provided with a gate stack 107 formed thereon, as shown in FIG. 1A. At step 202, a first etching step is performed to form a recess 110 aside the gate stack 107, as shown in FIG. 1B. In some embodiments, the first etching step includes performing an anisotropic etching process. In some embodiments, the ratio of the width $W_{G1}$ of the gate stack 107 to the depth $D_0$ of the recess 110 ranges from about 0.4 to 0.7. At step 204, a second etching step is performed to deepen and widen the recess 110 to form a recess 111, as shown in FIG. 1C. In some embodiments, the second etching step includes performing an isotropic etching process. At step 206, a strained layer 112 is formed in the recess 111, as shown in FIG. 1D. At step 208, the gate stack 107 is replaced with a metal gate stack 117, as shown in FIG. 1E. The FinFET device of the disclosure is thus completed with the described process steps. However, it is not limited to add one or more additional steps among the above steps for fabricating the FinFET device.

Figure 4:
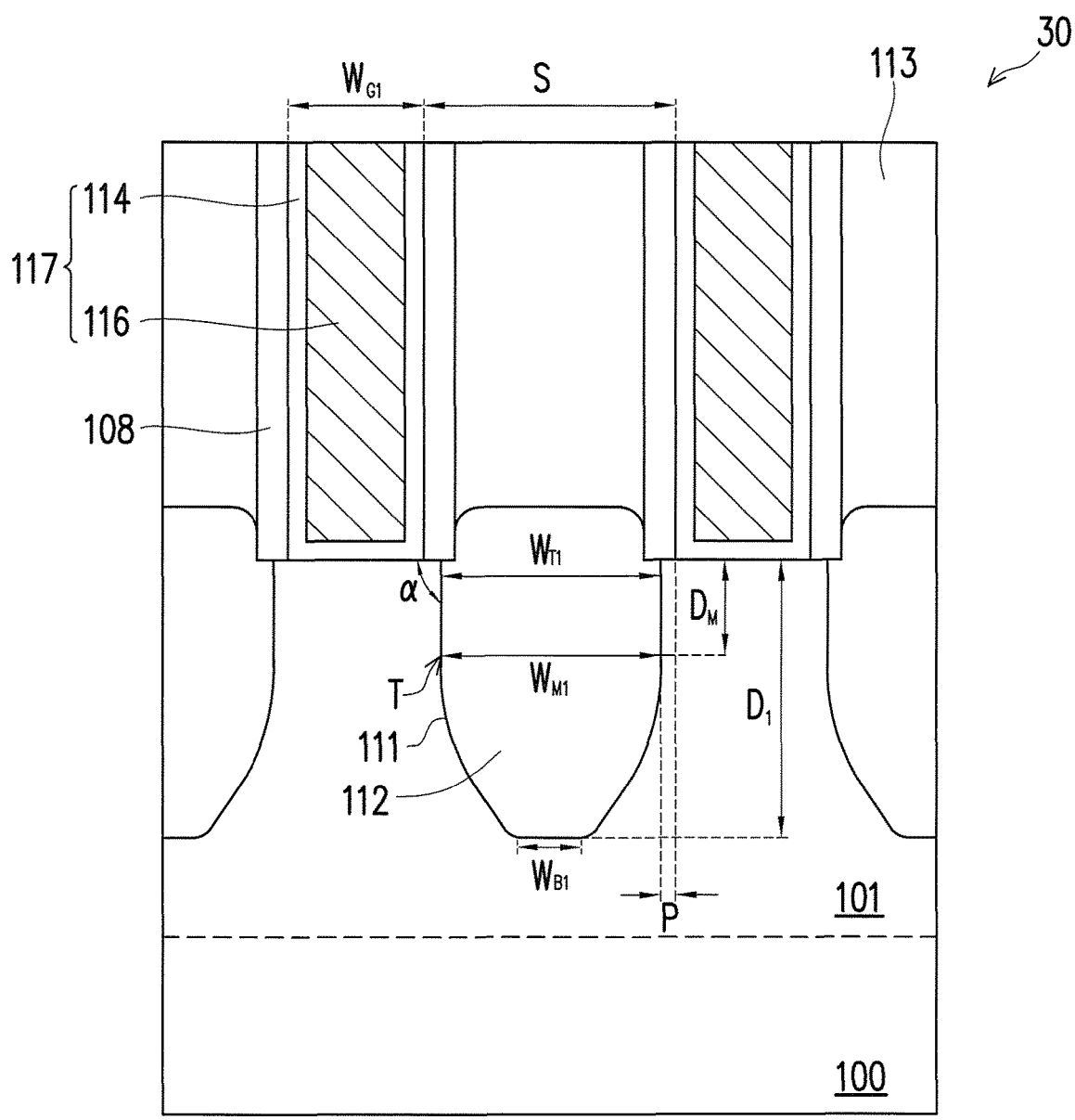
FIG. 4 is a schematic cross-sectional view of a FinFET device in accordance with yet alternative embodiments.

In the above embodiments, the recesses 111 (or strained layers 112) are formed with a wide-middle profile in which the top width is smaller than the middle width of the recesses 111 (or strained layers 112), and thus, the included angle $\alpha$ between the upper sidewall of each recess 111 (or strained layer 112) and the surface of the substrate 100 is in a range of substantially equal to or greater than 50 degrees and less than 90 degrees. However, the present disclosure is not limited thereto. In alternative embodiments, as shown in FIG. 4, the recesses 111 (or strained layers 112) are formed with a bucket-like profile in which the top width is substantially equal to the middle width of the recesses 111 (or strained layers 112), and thus, the included angle α between the upper sidewall of each recess 111 (or strained layer 112) and the surface of the substrate 100 is about 90 degrees.

The structures of the FinFET devices of the disclosure are described below with reference to FIG. 1E, FIG. 2 and FIG. 4. In some embodiments, the FinFET device 10/20/30 of the disclosure includes a substrate 100 having at least one fin 101, two gate stacks 117 across the at least one fin 101, and a strained layer 112 in a recess 111 of the substrate 100 and between the gate stacks 117.

In some embodiments, the ratio of a depth $D_M$ at the greatest width of the recess 111 to a width $W_{G1}$ of the gate stack 117 ranges from about 0.5 to 0.7. In some embodiments, the ratio of a width $W_{G1}$ of the gate stacks 117 to the greatest width $W_{M1}$ of the recess 111 ranges from about 0.4 to 0.6. In some embodiments, the ratio of a depth $D_M$ at the greatest width of the recess 111 to a total depth $D_1$ of the recess 111 ranges from about ¼ to ⅓.

In some embodiments, the strained layers 112 have a wide-middle profile or a bucket-like profile. In some embodiments, the included angle α between an upper sidewall of the recess 111 and a surface of the substrate 100 is from about 50 degrees to 90 degrees. In some embodiments, the top width is smaller than the middle width of the recess 111, as shown in FIG. 1E and FIG. 2. In alternative embodiments, the top width is substantially equal to the middle width of the recess 111, as shown in FIG. 4.

In some embodiments, the FinFET device 10/20/30 of the disclosure further includes spacers 108 on sidewalls of the gate stacks 117. In some embodiments, a top edge of the recess 111 is aligned with the sidewalls of the spacers 108, as shown in FIG. 1E. In alternative embodiments, a top edge of the recess 111 is covered by the spacers 108, as shown in FIG. 2 and FIG. 4. Besides, the greatest width $W_{M1}$ of the recess 111 is no more than a distance (e.g., spacing width S) between the gate stacks 117.

The above embodiments in which each of the gate dielectric layers, the gates, the spacers, the strained layers and the dielectric layer is a single layer are provided for illustration purposes, and are not construed as limiting the present disclosure. In some embodiments, at least one of these described elements can be a multi-layer structure as needed.

In the above embodiments, the method of the disclosure is applied to a FinFET device process, but the disclosure in not limited thereto. In alternative embodiments, the method of disclosure can be applied to a planar device process.

Figure 5:
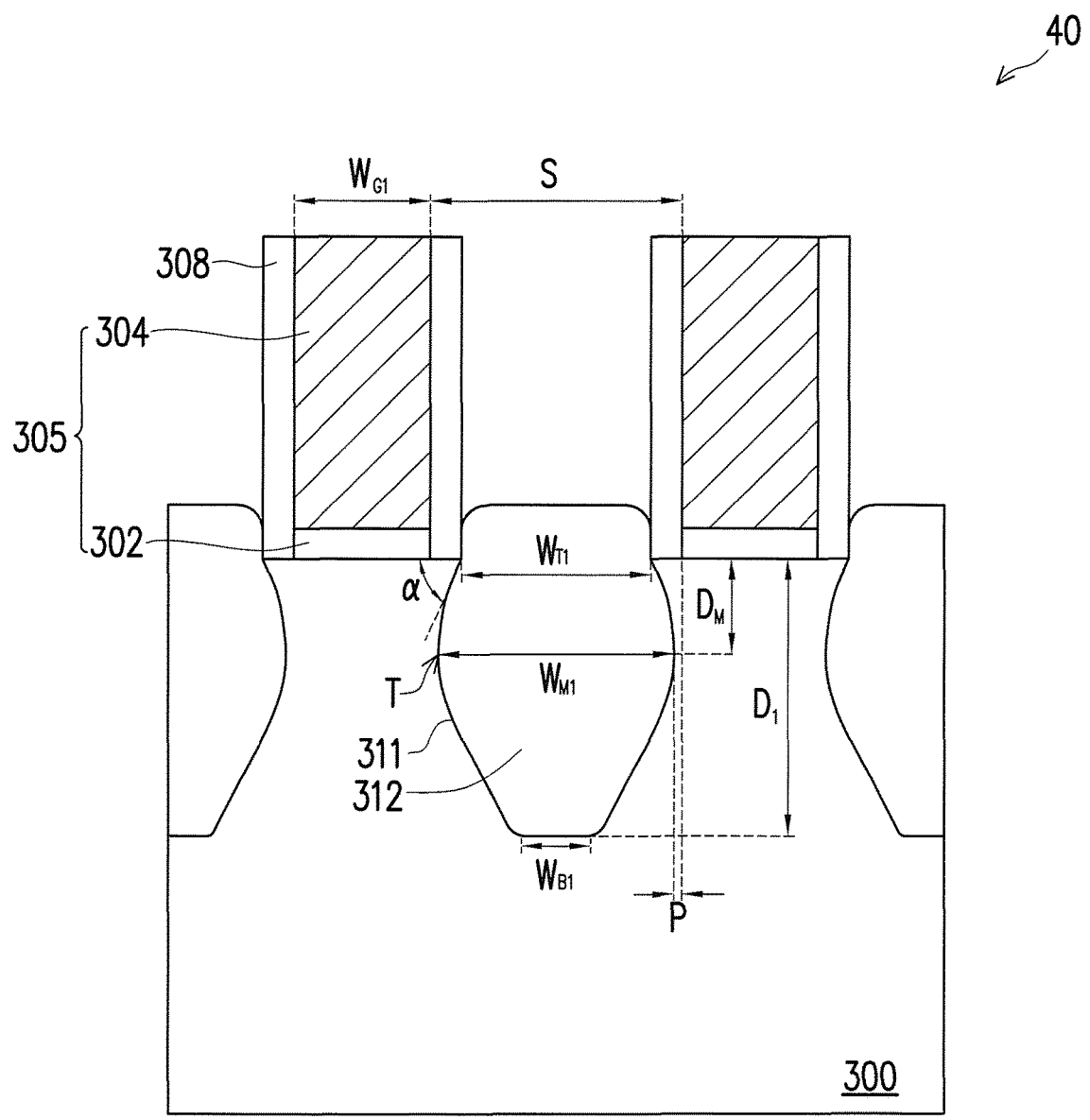
FIG. 5 to FIG. 7 are schematic cross-sectional views of semiconductor devices in accordance with some embodiments.
Figure 6:
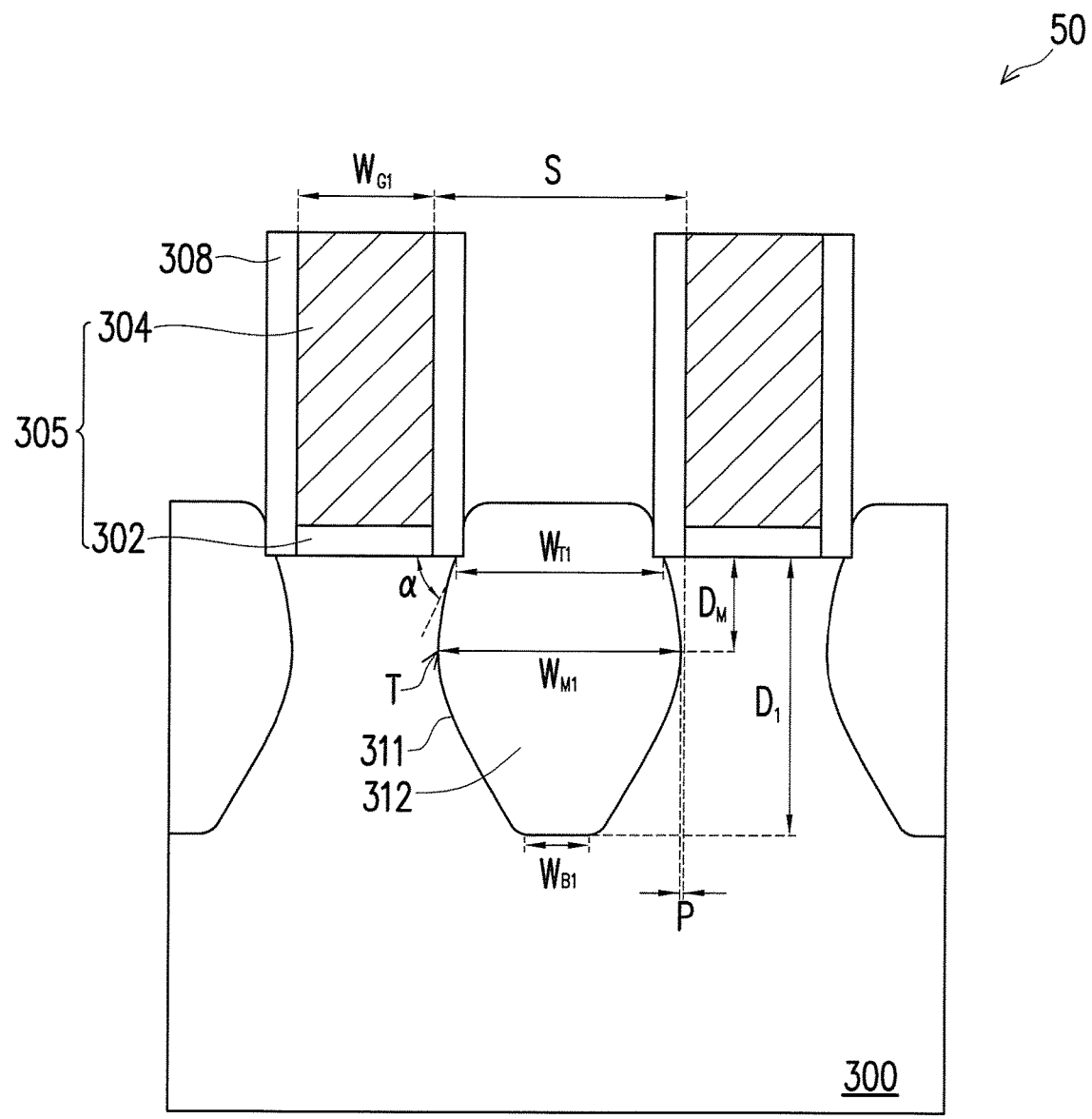
Figure 7:
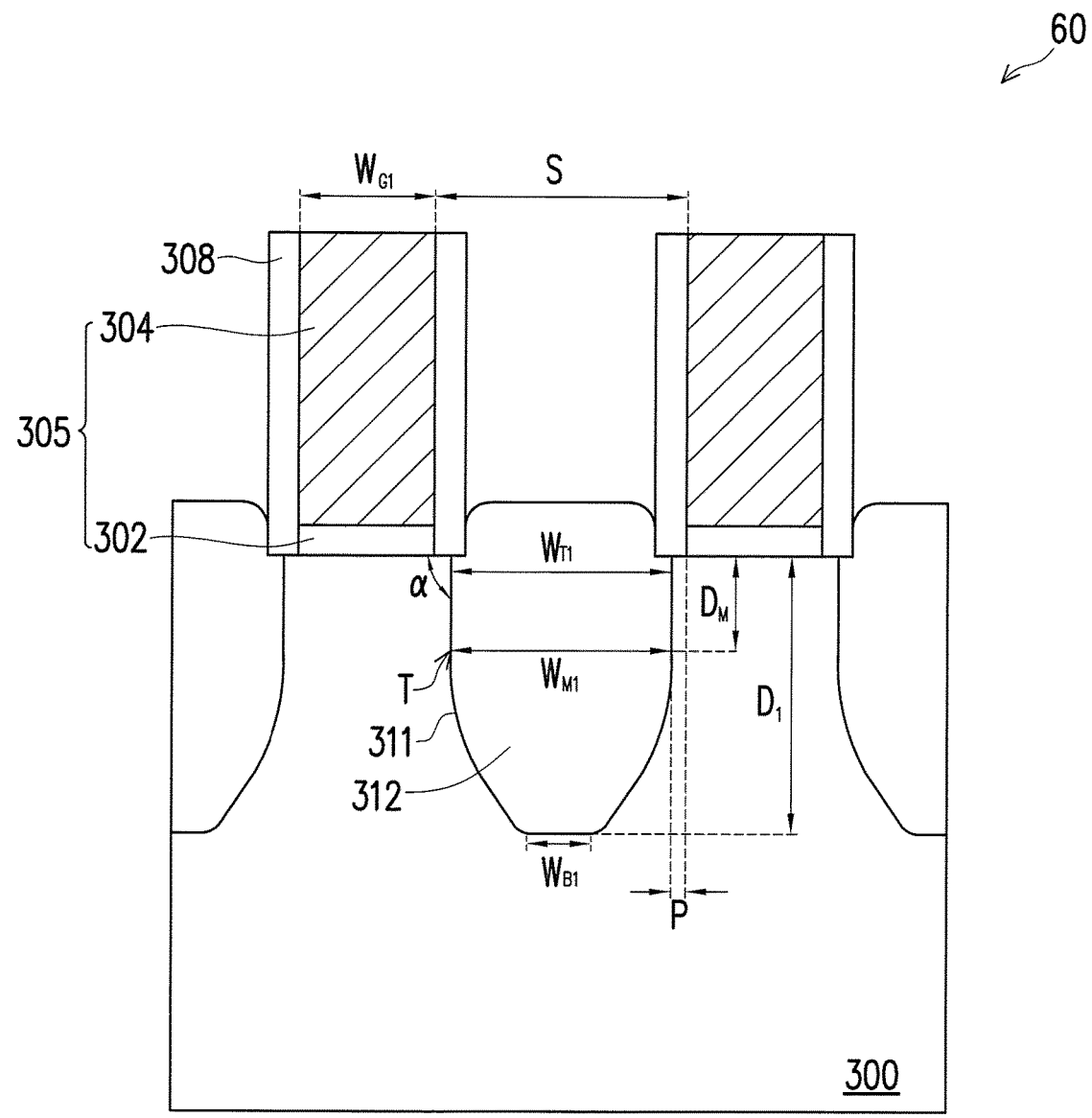

FIG. 5 to FIG. 7 are cross-sectional views of semiconductor devices in accordance with alternative embodiments.

As shown in FIG. 5 to FIG. 7, a semiconductor device 40/50/60 includes a planar substrate 300, gate stacks 305, spacers 308 and strained layers 312. In some embodiments, each of the gate stacks 305 includes a gate dielectric layer 302 on the planar substrate 300 and a gate 304 on the gate dielectric layer 302. In some embodiments, the gate dielectric layer 302 includes silicon oxide, a high-k material or a combination thereof. The gate 304 includes a silicon-containing material, a metal-containing material or a combination thereof. The spacers 308 are formed on sidewalls of the gate stacks 305.

The gates stacks 305, spacers 308 and strained layers 312 are similar to the gate stacks 107, spacers 108 and strained layers 112, and the details are not iterated herein. Specifically, the structures of FIG. 5, FIG. 6 and FIG. 7 are similar to the structures of FIG. 1E, FIG. 2 and FIG. 4, and the difference between them lies in that the former structures are formed on a planar substrate without fins, while the later structures are formed on a substrate with fins. Therefore, the ratios, shapes and relationships between elements of FIG. 1E, FIG. 2 and FIG. 4 are applicable to the structures of FIG. 5, FIG. 6 and FIG. 7.

In the above-mentioned embodiments, a "gate last" process is implemented to form a FinFET device. However, another process such as a "gate first" process can be applied by using similar processes as described herein. The methods disclosed herein can be easily integrated with a CMOS process flow and do not require additional complicated steps to achieve the desired results. It is understood that embodiments disclosed herein offer different advantages, and that no particular advantage is necessarily required for all embodiments.

In view of the above, in some embodiments, by controlling and adjusting the ratio of the tip depth (e.g., $D_M$) of the recess to the gate width (e.g., $W_{G1}$), the ratio of the gate width (e.g., $W_{G1}$) to the greatest depth (e.g., $W_{M1}$) of the recess, the ratio of the tip depth (e.g., $D_M$) to the total depth (e.g., $D_1$) of the recess, and/or the included angle (e.g., a) between the recess sidewall and the substrate surface within the specific ranges of the disclosure, the profiles of the recesses and therefore the strained layers are well defined. Therefore, the strained layers are suitable to impart more stress on the channel region, and the electrical performance of the device is accordingly boosted.

In accordance with some embodiments of the present disclosure, a FinFET device includes a substrate, a gate stack over the substrate and a strained layer in a recess of the substrate and aside the gate stack. Besides, a ratio of a depth at the greatest width of the recess to a width of the gate stack ranges from about 0.5 to 0.7.

In accordance with alternative embodiments of the present disclosure, a FinFET device includes a substrate having at least one fin, two gate stacks across the at least one fin, and a strained layer in a recess of the substrate and between the gate stacks. Besides, a ratio of a width of the gate stacks to the greatest width of the recess ranges from about 0.4 to 0.6.

In accordance with yet alternative embodiments of the present disclosure a method of forming a FinFET device including the following steps. A substrate having a gate stack formed thereon is provided. A first etching step is performed to form a recess in the substrate aside the gate stack, wherein a ratio of a width of the gate stack to a depth of the recess ranges from about 0.4 to 0.7. A second etching step is performed to deepen and widen the recess. A strained layer is formed in the recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a gate stack over the substrate; and a strained layer in a recess of the substrate and aside the gate stack, wherein a ratio of a depth at the greatest width of the recess to a width of the gate stack ranges from about 0.5 to 0.7, wherein the semiconductor device further comprises a spacer on a sidewall of the gate stack, a top edge of the recess is covered by and spaced apart from an outer edge of the spacer, a sidewall of the recess connecting the top edge and a bottom edge of the recess is a curved surface without a sharp turning point, and an included angle between an upper portion of the sidewall of the recess and a surface of the substrate is from about 50 degrees to 90 degrees, and wherein the substrate is a substrate with at least one fin extending in a first direction, and the gate stack extends in a second direction different from the first direction and is across the at least one fin.

2. The semiconductor device of claim 1, wherein a top width of the recess is smaller than a middle width of the recess.

3. A FinFET device, comprising:
a substrate having at least one fin;
two gate stacks across the at least one fin; and
a strained layer in a recess of the substrate and between the gate stacks,
wherein a ratio of a width of the gate stacks to the greatest width of the recess ranges from about 0.4 to 0.6,
wherein the FinFET device further comprises spacers on sidewalls of the gate stacks, a top edge of the recess is covered by and spaced apart from outer edges of the spacers, a sidewall of the recess connecting the top edge and a bottom edge of the recess is a curved surface without a sharp turning point, and an included angle between an upper portion of the sidewall of the recess and a surface of the substrate is from about 50 degrees to 90 degrees.

4. The FinFET device of claim 3, wherein a ratio of a depth at the greatest width of the recess to the width of the gate stacks ranges from about 0.5 to 0.7.

5. The FinFET device of claim 3, wherein a ratio of a depth at the greatest width of the recess to a total depth of the recess ranges from about ¼ to ⅓.

6. The FinFET device of claim 3, wherein a middle width of the recess is greater than each of a top width and a bottom width of the recess.

7. The FinFET device of claim 3, wherein the greatest width of the recess is no more than a distance between the gate stacks.

8. A method of forming a FinFET device, comprising:
providing a substrate having a gate stack formed thereon;
performing a first etching step to form a recess in the substrate aside the gate stack, wherein a ratio of a width of the gate stack to a depth of the recess ranges from about 0.4 to 0.7;
performing a second etching step to deepen and widen the recess, wherein a top edge of the recess after the second etching step is covered by and spaced apart from an outer edge of a spacer on a sidewall of the gate stack, a sidewall of the recess connecting the top edge and a bottom edge of the recess is a curved surface without a sharp turning point, and an included angle between an upper portion of the sidewall of the recess and a surface of the substrate is from about 50 degrees to 90 degrees; and
forming a strained layer in the recess.

9. The method of claim 8, wherein the first etching step comprises an anisotropic etching process.

10. The method of claim 8, wherein the second etching step comprises an isotropic etching process.

11. The method of claim 8, wherein the recess has a wide-middle profile after the second etching step.

* * * * *